United States Patent [19]

Gelston, II

[11] Patent Number: 5,090,847

[45] Date of Patent: Feb. 25, 1992

[54] PRESSURE FOOT FOR MICROWAVE DRILL DETECTION SYSTEM

[75] Inventor: Norbert E. Gelston, II, Skaneateles, N.Y.

[73] Assignee: U.S. Tech Corporation, East Syracuse, N.Y.

[21] Appl. No.: 347,526

[22] Filed: May 4, 1989

[51] Int. Cl.⁵ ............................................. B23B 49/00
[52] U.S. Cl. ..................................... 408/16; 408/67; 408/95; 408/6; 409/137
[58] Field of Search ................ 324/58.5 B, 58.5 C, 324/58.5 A, 647, 648; 408/5, 6, 16, 95, 97, 98, 710, 67; 409/134, 137; 250/561

[56] References Cited

U.S. PATENT DOCUMENTS

| | | | |
|---|---|---|---|
| 3,241,402 | 3/1966 | Crowell et al. | 408/6 |
| 3,753,086 | 8/1973 | Shoemaker, Jr. | 324/58.5 B X |
| 3,870,957 | 3/1975 | Straw | 455/117 |
| 3,912,925 | 10/1975 | Gaskell | 408/6 X |
| 3,927,369 | 12/1975 | Billeter et al. | 324/58.5 C |
| 3,980,974 | 9/1976 | Yamamoto et al. | 333/33 |
| 3,990,805 | 11/1976 | Ducrohet | 324/161 X |
| 4,075,727 | 8/1977 | Yuetal | 324/58.5 B |
| 4,118,139 | 10/1978 | Lemelson | 408/12 |
| 4,340,326 | 7/1982 | Buanauro et al. | 409/134 X |
| 4,502,823 | 3/1985 | Wronski et al. | 409/134 |
| 4,613,812 | 9/1986 | Gelston, II | 408/6 X |
| 4,700,127 | 10/1987 | Sasaki et al. | 324/58.5 C |
| 4,822,219 | 4/1989 | Wood et al. | 408/95 X |

FOREIGN PATENT DOCUMENTS 52-119586 7/1977 Japan.
1149148 4/1985 U.S.S.R. ................. 324/58.5 A

OTHER PUBLICATIONS

Copy of a material cross-section symbol schedule from the American Drafting Standard Manual published by the ASME.
Copy of Schedule which is a programmed part of CAD system used at U.S. Tech Corporation.
V. D. Homburg, Technische Rundschau, No. 44, 1st Nov. 1983, p. 25, with translation.
George L. Ragan, Microwave Transmission Circuits, McGraw-Hill Book Company, Inc., 1948, pp. 484-489.
P. I. Somlo, IEEE Transaction on Microwave Theory and Techniques MTT-32 (1984) Jan., No. 1, New York, pp. 120-122.

Primary Examiner—Larry I. Schwartz
Assistant Examiner—Robert Schultz
Attorney, Agent, or Firm—Rosenman & Colin

[57] ABSTRACT

A pressure foot for a microwave drill detection system has a cavity in the base, a cover closing the opening into the cavity, with the cover and the base being designed to inhibit microwave radiation leakage, whereby a microwave beam directed toward a drill bit in the cavity is substantially confined within the cavity.

22 Claims, 2 Drawing Sheets

PRESSURE FOOT FOR MICROWAVE DRILL DETECTION SYSTEM

The present invention relates to a pressure foot for a drilling machine, and more particularly to a pressure foot useful in a microwave detection system for detecting the presence of a drill bit.

Printed circuit boards require holes to be drilled with high accuracy with regard to size and spacing. The drilling is usually done in a gang fashion on a machine having a plurality of individual drill spindles. Since the machines operate at speeds of up to 400 cycles per minute, the positioning of the drill spindles with respect to the PC boards is generally computer controlled.

Typical hole sizes which are drilled by the PC board drilling machines range from 0.004 inches to 0.25 inches. The combination of high drilling rate, small drill bit size and other factors occasionally results in a drill bit being broken. Gelston U.S. Pat. No. 4,613,812, issued Sept. 23, 1986, provides a microwave detection system for accurately determining when a drill bit has been broken so that it can be immediately replaced. Drilling machines presently using this microwave detection system include a pressure foot that is connected to each drill spindle assembly and is pressed down against the PC board to clamp the board in a fixed position for each drilling operation. The pressure foot includes a central opening through which the spindle chuck and drill bit extends. A microwave beam is directed through a microwave guide in the base of the pressure foot and into the central opening, with the drill bit lying in the path of the microwave beam. The microwave detection system of the Gelston patent will detect the presence or absence of a drill bit, and will also detect whether the drill bit is broken, so that the broken or missing bit can be replaced by an intact drill bit.

In the Gelston microwave detection system thus described, each spindle chuck of the drilling machine is located above the top surface of the base of its associated pressure foot during the time when the microwave beam is directed toward the drill bit. Part of the microwave beam of electromagnetic energy escapes into the unconfined space between the base of the pressure foot and the spindle chuck, and some may come back into the system.

The present invention is based upon the discovery that the operation of a microwave drill bit detection system is significantly improved if the pressure foot has a chamber through which the drill bit extends, the chamber being apperture-coupled to the microwave transmission waveguide, whereby microwave electromagnetic energy is confined to the chamber to thus inhibit leakage of microwave radiation from the chamber.

Accordingly, the present invention provides a pressure foot for a microwave drill detection system, comprising a metallic base having opposed top and bottom surfaces with a cavity in the base, the top surface having an opening therein forming an entrance to the cavity, and the bottom surface having an opening therein forming an exit from the cavity. A metallic cover is provided for closing the entrance of the cavity, the cover having a bore therethrough aligned with the openings in the top and bottom surfaces such that a drill bit may be extended through the bore and through the cavity to a position beyond the exit from the cavity.

A microwave transmission channel is formed in the base having an outlet in microwave communication with the cavity and an inlet remote from the cavity, whereby a microwave beam of electromagnetic energy may be directed through the channel and into the cavity for detection of a drill bit. The microwave beam is substantially confined in the cavity, thereby improving the efficiency of the operation of the microwave drill detection system.

In a preferred embodiment of the present invention, a conduit is provided having an inlet in fluid communication with the cavity and an outlet remote from the cavity, whereby suction may be applied to the cavity to remove debris formed during the drilling operation.

In another preferred embodiment of the invention, the cover has a plug portion having distal and proximal ends and a flange portion at the proximal end extending around and projecting away from the plug portion, the cover thus closing the cavity entrance with the plug portion being inserted into the cavity and the flange portion resting on the top surface of the base. In this embodiment, the bore described above will extend through the plug portion.

In another preferred embodiment of the invention, the cavity in the base is bowl-shaped, with a large circular opening forming the entrance to the cavity and a smaller circular opening forming the exit from the cavity.

The present invention is illustrated in terms of its preferred embodiments in the accompanying drawings in which FIG. 1 is a elevational view, partly in section, of a prior art pressure foot and its associated spindle chuck and drill bit;

Figure 1:
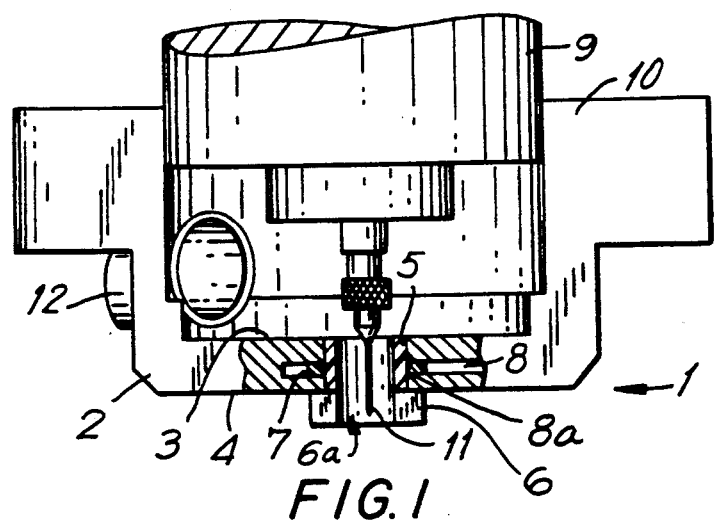

With reference to the drawings, the prior art pressure foot 1 illustrated in FIG. 1 has a base 2 with top surface 3 and bottom surface 4. Formed in the base 2 is a central opening 5 in which is inserted a plastic insert 6 and plastic ring 7, both preferably being made of Teflon.

Formed in the base is a microwave guide channel 8 in communication with the central opening 5 of the base. As shown in FIG. 1, a spindle chuck 9 is positioned for reciprocal vertical movement within the semi-circular wall 10 of the pressure foot 1. Spindle 9 can be lowered so that the drill bit 11 will extend beyond the insert 6 and drill the appropriate hole in the array of circuit boards (not shown) below the pressure foot 1. After the drilling operation is completed, the spindle 9 is raised to the position shown in FIG. 1, such that the drill bit 11 is about 0.05 inches above the bottom of insert 6. The microwave drill detection system described above will scan the interior of the insert 6 by means of a microwave beam directed through the guide channel 8 of the base 1 and exiting from the outlet 8a. Insert 6 and ring 7 are transparent to microwave radiation, and hence the microwave beam contacts drill bit 11. Since the wall 10 of the base is semicircular, the microwave beam is substantially unconfined and readily escapes through the large opening formed between the spindle 9, the wall 10 and the top surface 3 of the base 2. Some of this escaped radiation may be reflected from the spindle 9 to join the radiation being processed by the microwave detection system. The unconfined space above the pressure foot 1 unpredictably and adversely affects the quality of the detection system.

Pressure foot 1 is also equipped with a conduit 12 for applying suction to the top surface 3 of the pressure foot 1 for removal of debris formed during the drilling operation. Insert 6 is slotted to allow air to be sucked into opening 5 and thence into conduit 12.

Figure 3:
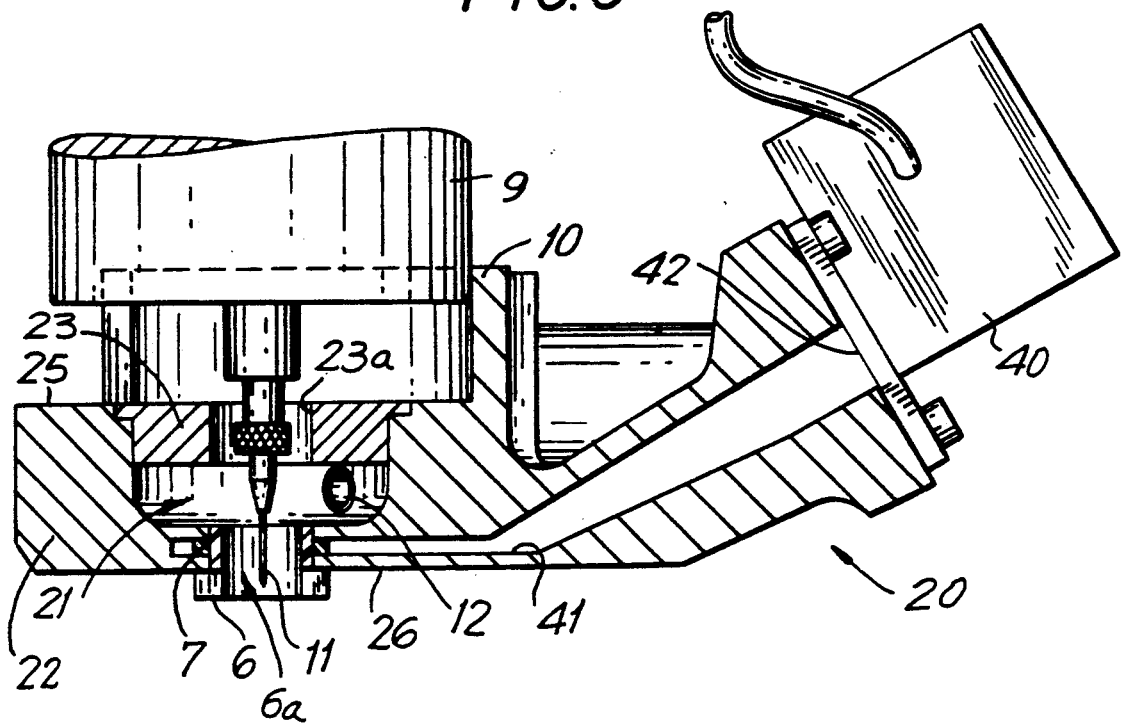
FIG. 3 is a view in section taken along lines 3—3 in FIG. 2.
Figure 4:
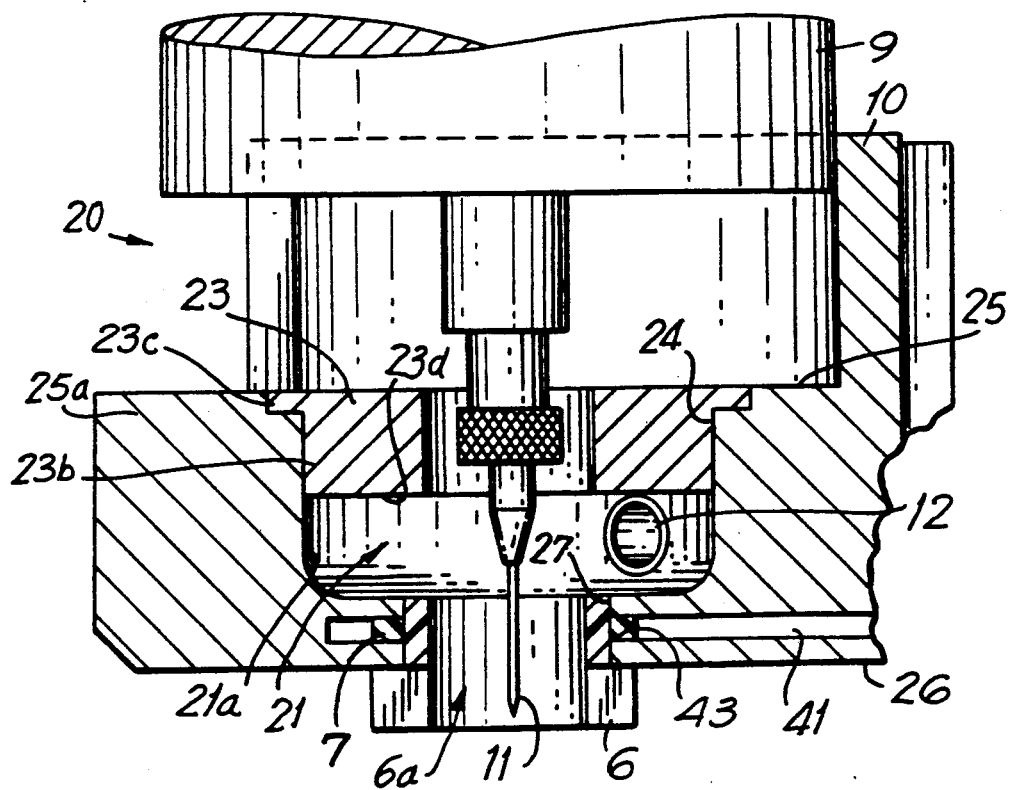
FIG. 4 is a detail view, in elevation, of a portion of the pressure foot shown in FIG. 3.

The present invention is illustrated in FIGS. 2-5. The pressure foot 20 of the present invention is shown as secured to a microwave transmitter/receiver device 40, which preferably operates according to the Gelston microwave detection system described above. As best seen in FIGS. 3 and 4, the pressure foot 20 of the present invention has a cavity 21 formed in metallic base 22 and a metallic cover 23 closing the opening 24 (FIG. 4) formed in the top surface 25 of base 22, the opening 24 providing an entrance into cavity 21. The bottom surface 26 of base 22 has an opening 27 (FIG. 4) therein that forms an exit from cavity 21. As in the case of the prior art pressure foot 1, the pressure foot 20 according to the invention also has a microwave transmission waveguide channel 41 communicating at its inlet 42 (FIG. 3) with microwave transmitter/receiver 40. A microwave beam of electromagnetic energy generated by unit 40 travels through the guide channel 41, exits via outlet 43, and is in microwave communication with the cavity 21. Pressure foot 20 also includes the slotted insert 6 and ring 7, preferably made of Teflon.

Cover 23 has a bore 23a therethrough enabling the spindle 9 to move the drill bit 11 into and through the cavity 21 to a position projecting beyond the bottom of the insert 6 so that the drill bit 11 can drill the appropriate hole in the array of circuit boards (not shown) located below and in contact with the insert 6. FIGS. 3 and 4 show the drill bit 11 in the position shown in FIG. 1 in which the spindle 9 has been retracted to its starting position. Suction conduit 12 communicates with cavity 21 for removal of debris formed during the drilling operation, as described above.

Cover 23 preferably has a cylindrical plug portion 23b (FIG. 4) and a circular flange portion 23c projecting away from the proximal end of plug portion 23b. Cover 23 fits into base 22 such that the plug portion 23b is inserted into cavity 21 while flange portion 23c rests on a ledge 25a (FIG. 4) formed in the top surface 25 of base 22. Cover 23 may be removed when access to cavity 21 is required.

Base 22 and cover 23 are formed of a metal, preferably aluminum. Pressure foot 20 may be cast from a mold having a plaster of paris insert which is removed from the casting to provide guide channel 40. Inserts 6 and 7 are fitted into pressure foot 20 in the same manner as they are fitted into the prior art pressure foot 1. Similarly, conduit 12 is attached to the pressure foot 20 in a conventional manner.

The operation of a microwave detection system using the pressure foot 20 of the present invention is as follows. A microwave beam of electromagnetic energy is generated by unit 40 in the manner described in the above-mentioned Gelston patent, the beam then travelling through the waveguide 41 and exiting outlet 43 into the central opening 6a (FIG. 4) of insert 6 into which drill bit 11 extends. A portion of the microwave energy within opening 6a is aperture-coupled to the cavity 21 via the opening 27 and thus enters the cavity 21. Once within the cavity 21, the microwave energy is essentially confined in the cavity 21 because the base 22 and the cover 23 are formed of a metallic material. Some microwave radiation may escape from and reenter the cavity 21 via bore 23a and opening 6a, but this is insignificant compared to the prior art pressure foot 1. The microwave radiation is thus confined to a predetermined volume defined by the shorting wall 23d (FIG. 4) of plug 23b and the inner wall 21a of cavity 21 in a reasonably predictable and consistent manner and is essentially independent of the location and nature of the spindle.

A suitable pressure foot 20 has been made in which the distance between the top surface 25 and the bottom surface 26 of the base 22 is about one inch, cavity 21 having a diameter of about 1.5 inches and a depth of about 0.75 inches. Insert 6 may suitably be about 0.5 inches in height and about 0.75 inches in diameter with a central opening of about 0.5 inches. With these dimensions in mind, cover 23 will have a flange 23c of a suitable size so as to securely fit on the top surface 25 and close opening 24, the dimension of the flange 23c not being at all critical. The diameter of bore 23a will be chosen to permit entry of the drill bit 11 into cavity 21.

The height or thickness of cover 23 will be empirically determined as follows. For a cavity 21 of given size, such as described above, cover 23 will preferably have a cylindrical plug portion 23b that closely contacts the inside wall 21a (FIG. 4) of cavity 21, has a flat face or wall 23d and is of sufficient length as to maximize the difference between the signals generated by the microwave drill detection system representing an intact drill bit and a broken drill bit, respectively. By trial and error, the length of the cylindrical plug portion 23b is chosen to provide an optimum length that will not obstruct conduit 12. For the cavity 21 described above, the length of cylindrical plug portion 23b may be about 0.25 to about 0.38 inches.

Bore 23a and the openings in the top and bottom surfaces are shown as circular, but any suitable shape may be used so long as the bore 23a is aligned with the openings 24,27 to permit the drill bit 11 to be extended through the bore 23a and through the cavity 21 to a position beyond the insert 6. Moreover, while cavity 21 is shown as bowl-shaped, with the opening 24 forming the cavity entrance being larger than the opening 27 forming the cavity exit, cavity 21 may be of any suitable shape, as desired. For best results, it is preferred that the outlet 43 of the microwave guide channel 41 will be adjacent the cavity exit so as to ensure good contact between the microwave radiation and drill bit 11.

Figure 5:
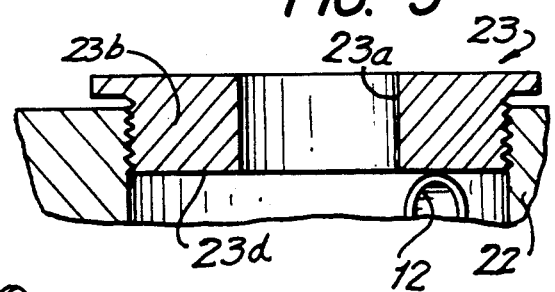
FIG. 5 is a detail view, in section, of another embodiment of the invention.
Figure 2:
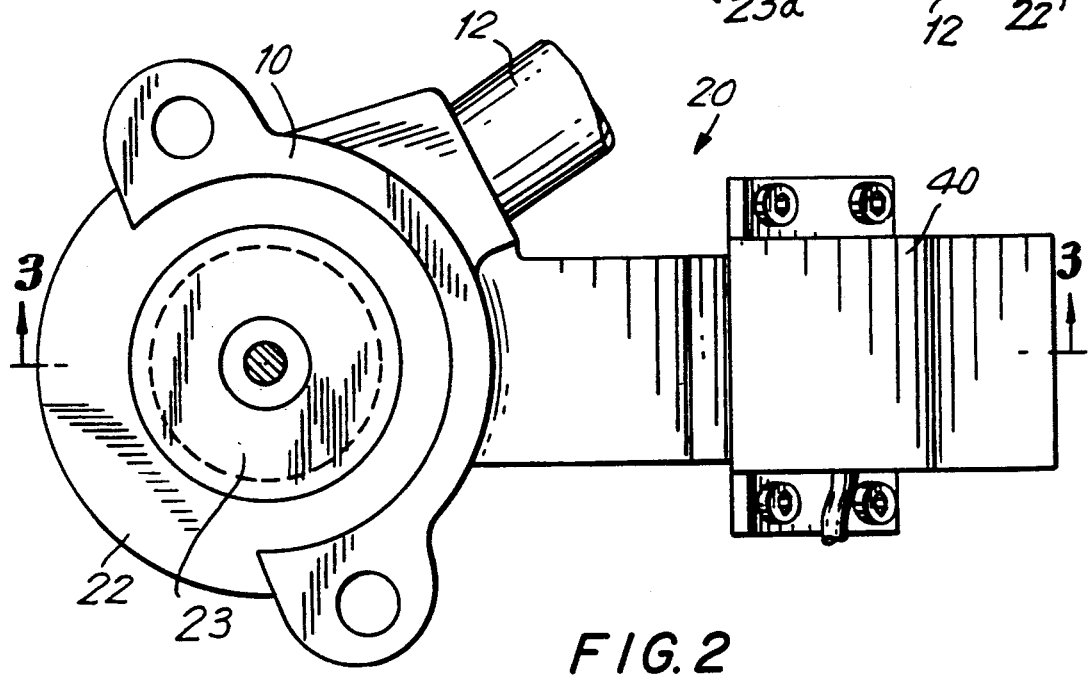
FIG. 2 is a plan view of the pressure foot according to the present invention.

FIG. 5 illustrates an embodiment of the invention in which plug portion 23b is screw threaded into cavity 21 so that the cavity 21 can be "tuned" by screwing plug portion 23b into the cavity 21 to obtain the optimum position of wall 23d in cavity 21.

What is claimed is:

1. A pressure foot for a microwave drill detection system, comprising
   a) a metallic base having opposed top and bottom surfaces, the bottom surface having an opening therethrough
   b) a cavity in said base having an upper end and a lower end, said bottom surface opening extending to said cavity lower end
   c) a metallic cover of pre-determined thickness disposed within said base at said cavity upper end, said cover having a bore therethrough aligned with said opening, whereby a drill bit may be extended through said bore, said cavity and said opening to a position beyond the bottom surface, d) microwave waveguide means in said base and being adjacent said cavity and having an outlet in microwave energy communication with said cavity through said opening and an inlet remote from said cavity, whereby the microwave energy used for detection is substantially confined within the created cavity, and e) means for generating a microwave signal through the waveguide means.

2. A pressure foot according to claim 1, wherein said cover and said base are composed of aluminum.

3. A pressure foot according to claim 1, wherein said cover has a plug portion having distal and proximal ends and a flange portion at said proximal end extending around and projecting away from said plug portion, said plug portion being inserted into said cavity and said flange portion resting on said top surface of said base, said bore extending through said plug portion.

4. A pressure foot according to claim 1, wherein said bore and said opening are circular.

5. A pressure foot according to claim 4, wherein said cover and said base are composed of aluminum.

6. A pressure foot according to claim 1, wherein said cavity is bowl-shaped, said bore and the opening are circular and form an entrance larger than the opening forming said cavity exit.

7. A pressure foot according to claim 6, wherein said plug portion is cylindrical.

8. A pressure foot according to claim 6, wherein said cover and said base are composed of aluminum.

9. A pressure foot according to claim 1, wherein said outlet of said microwave channel means is adjacent the exit of the cavity.

10. A pressure foot according to claim 5, wherein said outlet of said microwave channel means is adjacent the exit of the cavity.

11. A pressure foot for a microwave drill detection system, comprising
a) a metallic base having opposed top and bottom surfaces, the bottom surface having an opening therethrough,
b) a cavity in said base having an upper end and a lower end, said bottom surface opening extending to said cavity lower end
c) a metallic cover of predetermined thickness disposed within one portion of the said base to at least partially close an open end of said cavity, said cover having a bore therethrough aligned with said opening, whereby a drill bit may be extended through said bore and said cavity to a position beyond the exit from said cavity,
d) microwave waveguide means in said base adjacent said cavity and having an outlet in microwave energy communication with said cavity and an inlet remote from said cavity,
e) means for generating a microwave signal through the waveguide means, whereby the microwave energy used for detection is substantially confined within the created cavity, and
f) conduit means for applying suction to said cavity having an inlet in fluid communication with said cavity and an outlet remote from said cavity.

12. A pressure foot according to claim 11, wherein said cover has a plug portion having distal and proximal ends and a flange portion at said proximal end extending around and projecting away from said plug portion, said plug portion being inserted into said cavity and said flange portion resting on said top surface of said base, said bore extending through said plug portion.

13. A pressure foot according to claim 11 wherein said bore and said opening are circular.

14. A pressure foot according to claim 12, wherein cover and said base are composed of aluminum.

15. A pressure foot according to claim 14, wherein said outlet of said microwave channel means is adjacent said cavity.

16. A pressure foot according to claim 11, wherein said cavity is bowl-shaped, said bore and said opening form an entrance larger than the opening forming said cavity exit.

17. A pressure foot according to claim 16, wherein said plug portion is cylindrical.

18. A pressure foot according to claim 11, wherein said cover and said base are composed of aluminum.

19. A pressure foot according to claim 11, wherein said outlet of said microwave channel means is adjacent the cavity.

20. A pressure foot according to claim 16 wherein said cover and said base are composed of aluminum.

21. A pressure foot according to claim 1, wherein said cover has a wall facing said bottom surface of said base when said cover is disposed within said base to create a cavity, said cover being selectively moveable with respect to said base to move said wall into said cavity to a predetermined position.

22. A pressure foot according to claim 11, wherein said cover has a wall facing said bottom surface of said base when said cover is disposed within said base, said cover being selectively moveable with respect to said base to move said wall into said cavity to a predetermined position.

* * * * *